(12) United States Patent
Zhang et al.

(10) Patent No.: US 8,958,078 B2
(45) Date of Patent: Feb. 17, 2015

(54) TWO-DIMENSIONAL, POSITION-SENSITIVE SENSOR-BASED SYSTEM FOR POSITIONING OBJECT HAVING SIX DEGREES OF FREEDOM IN SPACE

(75) Inventors: Ming Zhang, Beijing (CN); Yu Zhu, Beijing (CN); Zhao Liu, Beijing (CN); Jinchun Hu, Beijing (CN); Dengfeng Xu, Beijing (CN); Kaiming Yang, Beijing (CN); Wensheng Yin, Beijing (CN); Haihua Mu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/234,870

(22) PCT Filed: Jul. 26, 2012

(86) PCT No.: PCT/CN2012/079204
§ 371 (c)(1),
(2), (4) Date: Feb. 27, 2014

(87) PCT Pub. No.: WO2013/013628
PCT Pub. Date: Jan. 31, 2013

(65) Prior Publication Data
US 2014/0160495 A1    Jun. 12, 2014

(30) Foreign Application Priority Data

Jul. 26, 2011   (CN) .......................... 2011 1 0210439

(51) Int. Cl.
*G01B 11/00*   (2006.01)
*G01B 11/03*   (2006.01)
(Continued)

(52) U.S. Cl.
CPC ............ *G01B 11/14* (2013.01); *G03F 7/70775* (2013.01)
USPC .......................................... 356/614; 356/139

(58) Field of Classification Search
USPC ..................... 356/237.1–241.6, 242.1–243.8, 356/426–431, 600–640
See application file for complete search history.

(56) References Cited

U.S. PATENT DOCUMENTS 5,418,611 A * 5/1995 Huang et al. ................ 356/141.2
7,733,477 B2 * 6/2010 Tan et al. .................... 356/241.1
(Continued)

FOREIGN PATENT DOCUMENTS

CN      2884141 Y    3/2007
CN    101382416 A    3/2009
(Continued)

OTHER PUBLICATIONS

Sun Changku et al., A Six Degree-of-freedom Measuring System, Chinese Journal of Scientific Instrument, Aug. 1998, pp. 362-365, vol. 19, China Academic Journal Electronic Publishing House, China.

(Continued)

*Primary Examiner* — Kara E Geisel
*Assistant Examiner* — Jarreas C Underwood
(74) *Attorney, Agent, or Firm* — Lowe Hauptman & Ham, LLP

(57) ABSTRACT

A two-dimensional, position-sensitive sensor-based system for positioning an object having six degrees of freedom in space, used for positioning of a silicon table and mask table of a lithography machine. The system comprises mainly a semiconductor laser 1, an optical fiber collimator 2, optical fibers 3, 7, 10, and 13, an optical fiber splitter 4, filter plates 6, 9, and 12, three PSD sensors 5, 8, and 11, and a signal processing system. Laser emitted by the semiconductor laser 1 is irradiated onto the optical fiber collimator 2, then transmitted respectively via three paths, and received by the PSD sensors 5, 8, and 11 after having background light filtered out by the filter plates 6, 9, and 12, while the positions of laser spots on the three PSD sensors 5, 8, and 11 are processed by the signal processing system to acquire the position and orientation.

2 Claims, 1 Drawing Sheet

(51) Int. Cl.
*G01B 11/14* (2006.01)
*G01C 1/00* (2006.01)
*G01C 9/00* (2006.01)
*G03F 7/20* (2006.01)

(56) References Cited

U.S. PATENT DOCUMENTS

| 2002/0011576 | A1* | 1/2002 | Cho et al. | 250/559.37 |
| 2003/0011787 | A1* | 1/2003 | Cho et al. | 356/614 |
| 2007/0085027 | A1* | 4/2007 | Baxter et al. | 250/491.1 |
| 2010/0053637 | A1* | 3/2010 | Isogai et al. | 356/614 |

FOREIGN PATENT DOCUMENTS

| CN | 101738161 A | 6/2010 |
| CN | 101968341 A | 2/2011 |
| CN | 102410836 A | 4/2012 |
| TW | 200842307 A | 11/2008 |

OTHER PUBLICATIONS

Eui Won Bae et al., Multi-degree-of-freedom displacement measurement system for milli-structures, Measurement Science and Technology, Aug. 16, 2001, pp. 1495-1502, vol. 12, IOP Publishing Ltd., UK.

Kuang Cui-Fang et al., Methods for simultaneously measuring five-dimension information by laser, Laser Technology, Jun. 2005, pp. 322-324, vol. 29, China Academic Journal Electronic Publishing House, China.

Kuang Cui-Fang et al., Methods for simultaneously measuring six freedom degrees of objects, Laser Technology, Oct. 2005, pp. 491-493, vol. 29, China Academic Journal Electronic Publishing House, China.

Feng Qi-Bo et al., Survey of Laser Methods for Simultaneously Measuring Multiple Parameters of CNC Machines, Laser & Infrared, Dec. 2000, pp. 331-333, vol. 30, China Academic Journal Electronic Publishing House, China.

FengZhou Fang et al., Method for Determining the Six Degrees of Freedom of an Object in Space, Precise Aerospace Manufacturing Technology, 1998, pp. 37-38, vol. 34, China Academic Journal Electronic Publishing House, China.

Zhigang Fan et al., Development of Multiple Degree of Freedom Technology, Journal of Applied Optics, Nov. 2003, pp. 1-4. vol. 24., China Academic Journal Electronic Publishing House, China.

Zhang Dun, The Development of four-degree-of freedom Measuring Apparatus Base on Single-mode Fiber-coupled Laser Module, Dec. 2006, pp. 1-48, Master's thesis of Beijing Jiaotong University, China.

Ye Shenghua et al., A spatial 5-DOF positioning system, Experiments and Measurements in fluid Mechanics, Jul. 1987, pp. 32-36, No. 2, China Academic Journal Electronic Publishing House, China.

International Search Report mailed Nov. 15, 2012 for PCT/CN2012/079204.

* cited by examiner

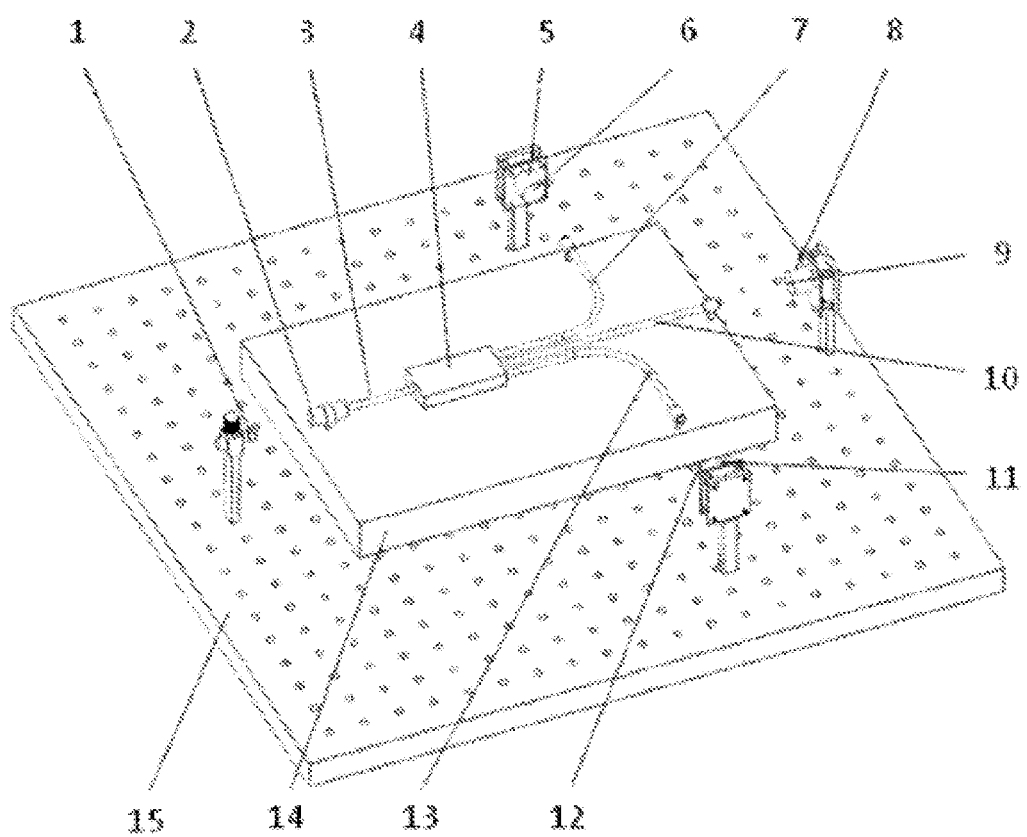

US 8,958,078 B2

TWO-DIMENSIONAL, POSITION-SENSITIVE SENSOR-BASED SYSTEM FOR POSITIONING OBJECT HAVING SIX DEGREES OF FREEDOM IN SPACE

CROSS REFERENCE TO RELATED APPLICATION

This application claims the priority of Chinese Patent Application No. 201110210439.3, filed on Jul. 26, 2011 in the SIPO (State Intellectual Property Office of the P.R.C). Further, this application is the National Phase application of International Application No. PCT/CN2012/079204 filed Jul. 26, 2012, which designates the United States and was published in Chinese.

TECHNICAL FIELD OF THE INVENTION

The present invention relates to an object positioning system, particularly to a contactless system for positioning an object having six degrees of freedom in space.

BACKGROUND OF THE INVENTION

Precise and quick positioning of an object having six degrees of freedom in space, represented by a silicon table and mask table of a lithography machine, is a necessary condition for implementing the precise movement control of the object. Currently, the object positioning in a space generally adopts a photoelectric encoder, a grating ruler, a magnetic encoder, a ultrasonic sensor, a vision sensor, a quadrant, an electric eddy current sensor, a laser interferometer and a laser ranging sensor, etc., but in positioning systems constituted by these sensors, either the sensor has a cable connection (the cable inevitably interferes with movement precision), or the positioning system has disadvantages of high cost and large volume. Therefore, there is desperately needed a contactless system for positioning an object in space without a cable connection while having characteristics of great positioning precision, expedited response, simple structure, and reduced cost.

SUMMARY OF THE INVENTION

An object of the present invention is to suggest a contactless system for positioning an object having six degrees of freedom in space, of great positioning precision, expedited response, and simple structure, with respect to the technical requirements for a silicon table and mask table of an existing lithography machine.

The technical solution of the present invention is as follows:

A two-dimensional position-sensitive sensor-based system for positioning an object having six degrees of freedom in space, characterized in that the system comprises a semiconductor laser, an optical fiber collimator, an input optical fiber, an optical fiber splitter, a first output optical fiber, a first filter plate, a first PSD sensor, a second output optical fiber, a second filter plate, a second PSD sensor, a third output optical fiber, a third filter plate, a third PSD sensor and a signal processing system; wherein laser emitted by the semiconductor laser is irradiated onto the optical fiber collimator, divided into three paths via the optical fiber splitter after being coupled into the input optical fiber by the optical fiber collimator, and then transmitted through the first output optical fiber, the second output optical fiber and the third output optical fiber, respectively, and received by the first PSD sensor, the second PSD sensor, and the third PSD sensor after being filtered out by the first filter plate, the second filter plate, and the third filter plate, respectively, while the positions of laser spots on the three PSD sensors are processed by the signal processing system; and wherein, the first PSD sensor, the second PSD sensor, and the third PSD sensor are corresponding to the three different side faces of an object to be measured, respectively; and the optical fiber collimator, the input optical fiber, the optical fiber splitter, the first output optical fiber, the second output optical fiber and the third output optical fiber are fixed on the object to be measured.

In the above technical solution, the semiconductor laser, the first filter plate, the second filter plate, the third filter plate, the first PSD sensor, the second PSD sensor, and the third PSD sensor are fixed on an external support.

The present invention has the following advantages and prominent effects: since the optical fiber collimator, the input optical fiber, the optical fiber splitter, the first output optical fiber, the second output optical fiber and the third output optical fiber have no cable connection with any object apart from the object to be measured, except internal connections. Thus, the system is a contactless positioning system which can avoid any effect of cables on object movement precision, and has such characteristics as great positioning precision, expedited response, simple structure, and reduced cost, etc.

BRIEF DESCRIPTION OF THE DRAWINGS

FIG. 1 is a schematic diagram of the structure of a technical solution of the present invention.

1-semiconductor laser; 2-optical fiber collimator; 3-input optical fiber; 4-optical fiber splitter; 5-first PSD sensor; 6-first filter plate; 7-first output optical fiber; 8-second PSD sensor; 9-second filter plate; 10-second output optical fiber; 11-third PSD sensor; 12-third filter plate; 13-third output optical fiber; 14-object to be measured; 15-external support.

DETAILED DESCRIPTION OF EMBODIMENTS OF THE INVENTION

The principle, structure and working process of the present invention will be further described below in conjunction with the drawings.

As shown in FIG. 1, the two-dimensional position-sensitive sensor-based system for positioning an object having six degrees of freedom in space, provided by the present invention comprises a semiconductor laser 1, an optical fiber collimator 2, an input optical fiber 3, an optical fiber splitter 4, a first output optical fiber 7, a first filter plate 6, a first PSD sensor 5, a second output optical fiber 10, a second filter plate 9, a second PSD sensor 8, a third output optical fiber 13, a third filter plate 12, a third PSD sensor 11 and a signal processing system; laser emitted by the semiconductor laser 1 is irradiated onto the optical fiber collimator 2, and divided into three paths via the optical fiber splitter 4 after being coupled into the input optical fiber 3 by the optical fiber collimator 2; the first path is transmitted through the first output optical fiber 7, and received by the first PSD sensor 5 after being filtered out by the first filter plate 6; the second path is transmitted through the second output optical fiber 10, and received by the second PSD sensor 8 after being filtered out by the second filter plate 9; and the third path is transmitted through the third output optical fiber 13, and received by the third PSD sensor after being filtered out by the third filter plate 12. The positions of laser spots on the three PSD sensors are processed by the signal processing system.

The optical fiber collimator 2, the input optical fiber 3, the optical fiber splitter 4, the first output optical fiber 7, the second output optical fiber 10 and the third output optical fiber 13 are fixed on the object to be measured 14.

The first PSD sensor 5, the second PSD sensor 8, and the third PSD sensor 11 are fixed on an external support 15, and are corresponding to the three different side faces of the object to be measured.

Since each PSD sensor can obtain two pieces of movement information of the object to be measured, the three PSD sensors can obtain six pieces of movement information altogether, and by using the six pieces of movement information, the position and orientation of the six degrees of freedom in space, of the object to be measured can be determined through a simple kinematics calculation.

The invention claimed is:

1. A two-dimensional position-sensitive sensor-based system for positioning an object having six degrees of freedom in space, characterized in that the system comprises a semiconductor laser (1), an optical fiber collimator (2), an input optical fiber (3), an optical fiber splitter (4), a first output optical fiber (7), a first filter plate (6), a first PSD sensor (5), a second output optical fiber (10), a second filter plate (9), a second PSD sensor (8), a third output optical fiber (13), a third filter plate (12), a third PSD sensor (11) and a signal processing system;

wherein, laser emitted by the semiconductor laser (1) is irradiated onto the optical fiber collimator (2), divided into three paths via the optical fiber splitter (4) after being coupled into the input optical fiber (3) by the optical fiber collimator (2), transmitted through the first output optical fiber (7), the second output optical fiber (10) and the third output optical fiber (13), respectively, and received by the first PSD sensor (5), the second PSD sensor (8), and the third PSD sensor (11) after being filtered out by the first filter plate (6), the second filter plate (9), and the third filter plate (12), respectively, while the positions of laser spots on the three PSD sensors are processed by the signal processing system; and wherein, the first PSD sensor (5), the second PSD sensor (8), and the third PSD sensor (11) are corresponding to the three different side faces of an object to be measured, respectively; and the optical fiber collimator (2), the input optical fiber (3), the optical fiber splitter (4), the first output optical fiber (7), the second output optical fiber (10) and the third output optical fiber (13) are fixed on the object to be measured (14).

2. The two-dimensional position-sensitive sensor-based system for positioning an object having six degrees of freedom in space according to claim 1, characterized in that the semiconductor laser (1), the first filter plate (6), the second filter plate (9), the third filter plate (12), the first PSD sensor (5), the second PSD sensor (8), and the third PSD sensor (11) are fixed on an external support (15).

* * * * *